US008494461B2

(12) United States Patent
Lo et al.

(10) Patent No.: US 8,494,461 B2
(45) Date of Patent: Jul. 23, 2013

(54) RADIO FREQUENCY TRANSMITTER FOR A WIRELESS LOCAL AREA NETWORK DEVICE

(75) Inventors: Shao-Chin Lo, Miaoli (TW); Chien-Cheng Lin, Taichung County (TW)

(73) Assignee: Ralink Technology, Corp., Jhubei, Hsinchu County (TW)

(*) Notice: Subject to any disclaimer, the term of this patent is extended or adjusted under 35 U.S.C. 154(b) by 394 days.

(21) Appl. No.: 12/426,288

(22) Filed: Apr. 20, 2009

(65) Prior Publication Data

US 2009/0280759 A1    Nov. 12, 2009

(30) Foreign Application Priority Data

May 7, 2008    (TW) ............................... 97116809 A

(51) Int. Cl.
*H04B 1/04* (2006.01)
(52) U.S. Cl.
USPC .................................. 455/114.3; 455/127.2

(58) Field of Classification Search
USPC ............. 455/127.1, 127.2, 114.2, 114.3, 296, 455/307
See application file for complete search history.

(56) References Cited

U.S. PATENT DOCUMENTS

| | | | | |
|---|---|---|---|---|
| 4,825,327 | A * | 4/1989 | Alexander et al. | 361/82 |
| 5,347,545 | A * | 9/1994 | Ishii et al. | 375/259 |
| 5,838,472 | A * | 11/1998 | Welch et al. | 398/151 |
| 6,005,885 | A * | 12/1999 | Warren et al. | 375/152 |
| 6,985,751 | B2 * | 1/2006 | Bartl et al. | 455/522 |
| 7,532,074 | B2 * | 5/2009 | Li et al. | 330/296 |
| 7,532,080 | B2 * | 5/2009 | Rhode et al. | 331/117 R |
| 2002/0042256 | A1 | 4/2002 | Baldwin | |
| 2004/0224648 | A1 | 11/2004 | Sugar | |
| 2008/0139141 | A1 * | 6/2008 | Varghese et al. | 455/114.3 |

* cited by examiner

*Primary Examiner* — William Hernandez
(74) *Attorney, Agent, or Firm* — Winston Hsu; Scott Margo

(57) ABSTRACT

An RF transmitter for a Wireless LAN device for enhancing an output linearity of the Wireless LAN device includes an RF processing unit for generating an RF signal, a voltage generator for generating a control voltage, a power amplifier coupled to the RF processing unit and driven by a bias, for amplifying power of the RF signal, and a low-pass filter coupled between the voltage generator and the power amplifier, for low-pass-filtering the control voltage to form the bias.

9 Claims, 5 Drawing Sheets

RADIO FREQUENCY TRANSMITTER FOR A WIRELESS LOCAL AREA NETWORK DEVICE

BACKGROUND OF THE INVENTION

1. Field of the Invention

The present invention relates to a radio frequency (RF) transmitter for a Wireless Local Area Network (Wireless LAN) device, and more particularly, to an RF transmitter for enhancing the output linearity of the Wireless LAN device.

2. Description of the Prior Art

Wireless communications products develop with the trend of low cost, small size, and high performance in modern life. Also, wireless communications protocols are getting complicated, so that it is difficult to properly design wireless communication products to meet many requirements. For example, power consumption of an 802.11n 2×2 Wireless LAN card is much higher than that of a former 802.11g Wireless LAN card. It will be a great challenge to design an 802.11n Wireless LAN card with high data transmission rate.

On the other hand, performance of a power supply has a direct influence on electrical equipment using it. When a switching regulator operates at a high frequency, it consumes less power and has 80%-90% efficiency, and thereby is suitable for Wireless LAN products for providing regulated DC power.

However, in the instant a large current is supplied to the Wireless LAN device, the output voltage of the switching power supply drops, and the operation voltage of the power amplifier drops accordingly, so that the output linearity of the Wireless LAN device is decreased. In addition, the power amplifier amplifies noise generated during the transition between transmission and reception, which also decreases the output linearity of the Wireless LAN device.

Please refer to FIG. 1, which is a schematic diagram of a Wireless LAN device 10 according to the prior art. The Wireless LAN device 10 can be a wireless communications product, such as a Wireless LAN card, or access point equipment. The Wireless LAN device 10 includes a voltage generator 101, a baseband processing unit 100, a radio frequency (RF) processing unit 102, an antenna 104, an RF receiver 106 and an RF transmitter 108. The voltage generator 101 is a switching regulator for generating a DC power. The baseband processing unit 100 is coupled to the voltage generator 101 and is utilized for processing a baseband signal and generating a control voltage Vctrl. The RF processing unit 102 is coupled to the voltage generator 101 and the baseband processing unit 100, and is utilized for performing transformation of the baseband signal into an RF signal.

The RF receiver 106 is coupled between the RF processing unit 102 and the antenna 104, and is utilized for receiving the RF signal via the antenna 104 and outputting the RF signal to the RF processing unit 102. The RF transmitter 108 is coupled to the baseband processing unit 100, the RF processing unit 102 and the antenna 104, and is utilized for transmitting the RF signal generated by the RF processing unit 102 to the air via the antenna 104. The RF transmitter 108 includes a power amplifier 180 and a resistor 182. The power amplifier 180 is coupled between the RF processing unit 102 and the antenna 104 and is driven by a bias Vref, for amplifying power of the RF signal. The resistor 182 is coupled between the baseband processing unit 100 and the power amplifier 180, and is utilized for transforming the control voltage Vctrl into the bias Vref.

Note that, in the conventional Wireless LAN device 10, the resistor 182 can only transform the control voltage Vctrl into the bias Vref, and cannot help reduce power noise in an input terminal of the power amplifier 180. Please refer to FIG. 2, which is an OFDM 64-QAM constellation of the Wireless LAN device 10 for an 802.11n Wireless LAN card. As shown in FIG. 2, deviations of signal points mean that error vector magnitude (EVM) of the output signals rises in the instant the voltage generator 101 supplies a large current, so that the output linearity and the data transmission rate of the Wireless LAN device 10 are decreased.

From the above, the conventional Wireless LAN device 10 cannot reduce power noise occurring in the input of the power amplifier 180. Therefore, noise will be amplified so that the output linearity of the Wireless LAN device 10 is decreased.

SUMMARY OF THE INVENTION

It is therefore a primary objective of the claimed invention to provide an RF transmitter for a Wireless LAN device, for enhancing the output linearity of the Wireless LAN device.

The present invention discloses an RF transmitter for a Wireless LAN device, for enhancing the output linearity of the Wireless LAN device. The RF transmitter comprises an RF processing unit, for generating an RF signal, a voltage generator, for generating a control voltage, a power amplifier coupled to the RF processing unit and driven by a bias, for amplifying power of the RF signal, and a low-pass filter coupled between the voltage generator and the power amplifier, for low-pass-filtering the control voltage to form the bias.

The present invention further discloses a Wireless LAN device capable of enhancing the output linearity. The Wireless LAN device comprises a voltage generator, a baseband processing unit, an RF processing unit, an antenna, an RF receiver and an RF transmitter. The voltage generator is utilized for generating regulated DC power. The baseband processing unit is coupled to the voltage generator, for processing a baseband signal and generating a control voltage. The RF processing unit is coupled to the voltage generator and the baseband processing unit, for performing transformation between the baseband signal and an RF signal. The RF receiver is coupled between the RF processing unit and the antenna, for receiving the RF signal via the antenna and outputting the RF signal to the RF processing unit. The RF transmitter is coupled to the baseband processing unit, the RF processing unit and the antenna, for transmitting the RF signal to the air via the antenna. The RF transmitter comprises a power amplifier coupled between the RF processing unit and the antenna and driven by a bias, for amplifying power of the RF signal, and a low-pass filter coupled between the baseband processing unit and the power amplifier, for low-pass-filtering the control voltage to form the bias.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
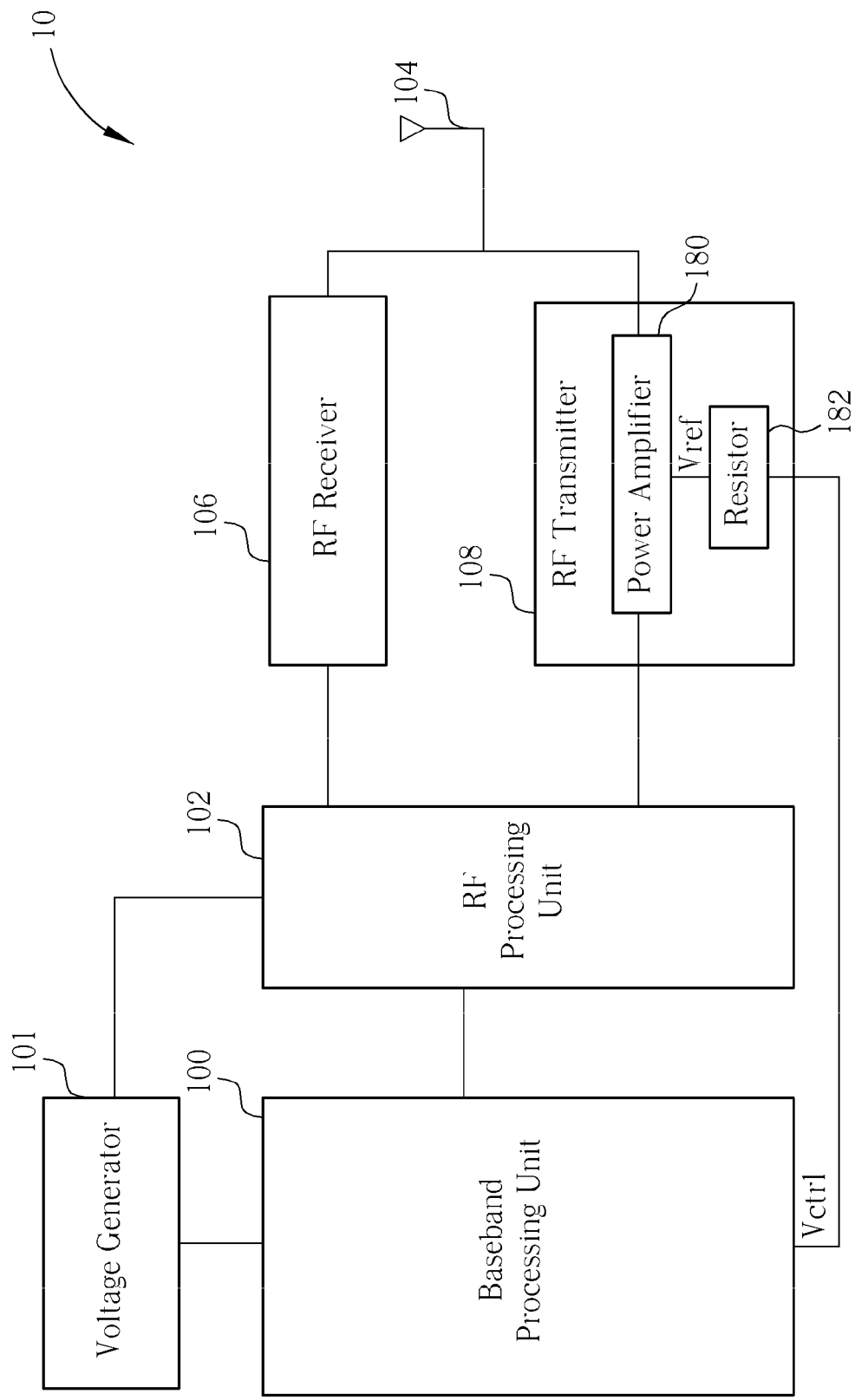
FIG. 1 is a schematic diagram of a Wireless LAN device according to the prior art.
Figure 2:
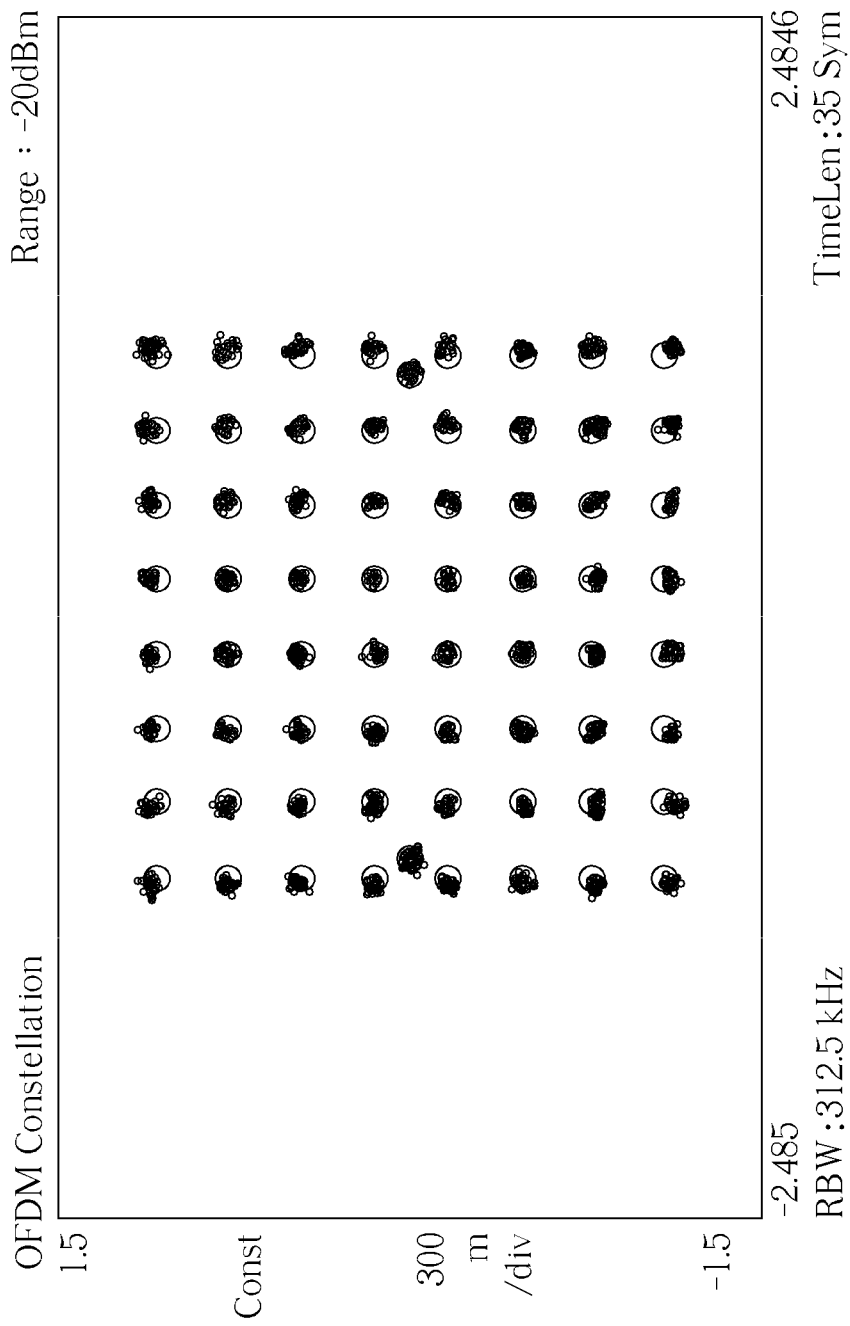
FIG. 2 is an OFDM 64-QAM constellation of the Wireless LAN device shown in FIG. 1 for an 802.11n Wireless LAN card.
Figure 3:
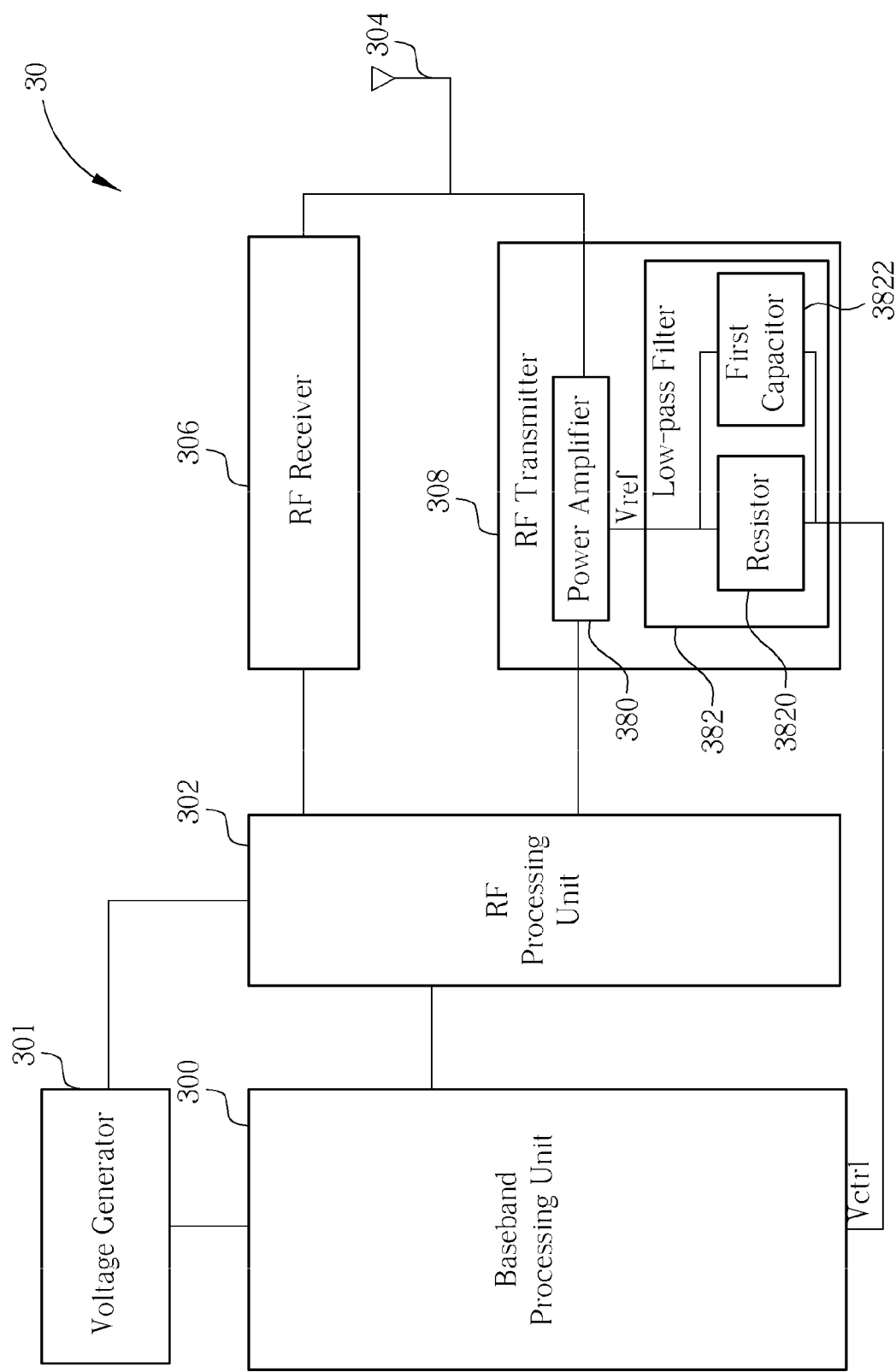
FIG. 3 is a schematic diagram of a Wireless LAN device according to an embodiment of the present invention.

Please refer to FIG. 3, which is a schematic diagram of a Wireless LAN device 30 according to an embodiment of the present invention. The Wireless LAN device 30 can be used in wireless communications products such as a Wireless LAN card and access point equipment. The Wireless LAN device 30 comprises a voltage generator 301, a baseband processing unit 300, an RF processing unit 302, an antenna 304, an RF receiver 306 and an RF transmitter 308. The voltage generator 301 is a switching regulator and is utilized for generating regulated DC power. The baseband processing unit 300 is coupled to the voltage generator 301, and is utilized for processing a baseband signal and generating a control voltage Vctrl. The RF processing unit 302 is coupled to the voltage generator 301 and the baseband processing unit 300, and utilized for transforming the baseband signal into an RF signal, or transforming the RF signal into the baseband signal. That is, the RF processing unit 302 is utilized for performing transformation of the baseband signal and the RF signal.

The RF receiver 306 is coupled between the RF processing unit 302 and the antenna 304, and is utilized for receiving the RF signal via the antenna 304 and outputting the RF signal to the RF processing unit 302. The RF transmitter 308 is coupled to the baseband processing unit 300, the RF processing unit 302 and the antenna 304, and is utilized for transmitting the RF signal generated by the RF processing unit 302 to the air via the antenna 304. The RF transmitter 308 comprises a power amplifier 380 and a low-pass filter 382. The power amplifier 380 is coupled between the RF processing unit 302 and the antenna 304 and is driven by a bias Vref, and is utilized for amplifying power of the RF signal generated by the RF processing unit 302. The low-pass filter 382 is coupled between the baseband processing unit 300 and the power amplifier 380, for low-pass-filtering the control voltage Vctrl to form the bias Vref.

In the Wireless LAN device 30, the low-pass filter 382 is utilized for performing a low-pass-filtering process on the control voltage Vctrl, and thereby provides the stable bias Vref to the power amplifier 380. As a result, the low-pass filter 382 can help decrease signal errors caused by power noise, so as to enhance the output linearity and data of the Wireless LAN device 30. Note that, the Wireless LAN device 30 is one of embodiments of the present invention, and those skilled in the art can make alterations and modifications accordingly. For example, the low-pass filter 382 can be composed of any other components capable of performing low-pass-filtering. In FIG. 3, the low-pass filter 382 comprises a resistor 3820 and a first capacitor 3822, which are both coupled between the baseband processing unit 300 and the power amplifier 380. In other words, the resistor 3820 is parallel with the first capacitor 3822. The resistor 3820 is utilized for transforming the control voltage Vctrl into the bias Vref of the power amplifier 380.

Figure 4:
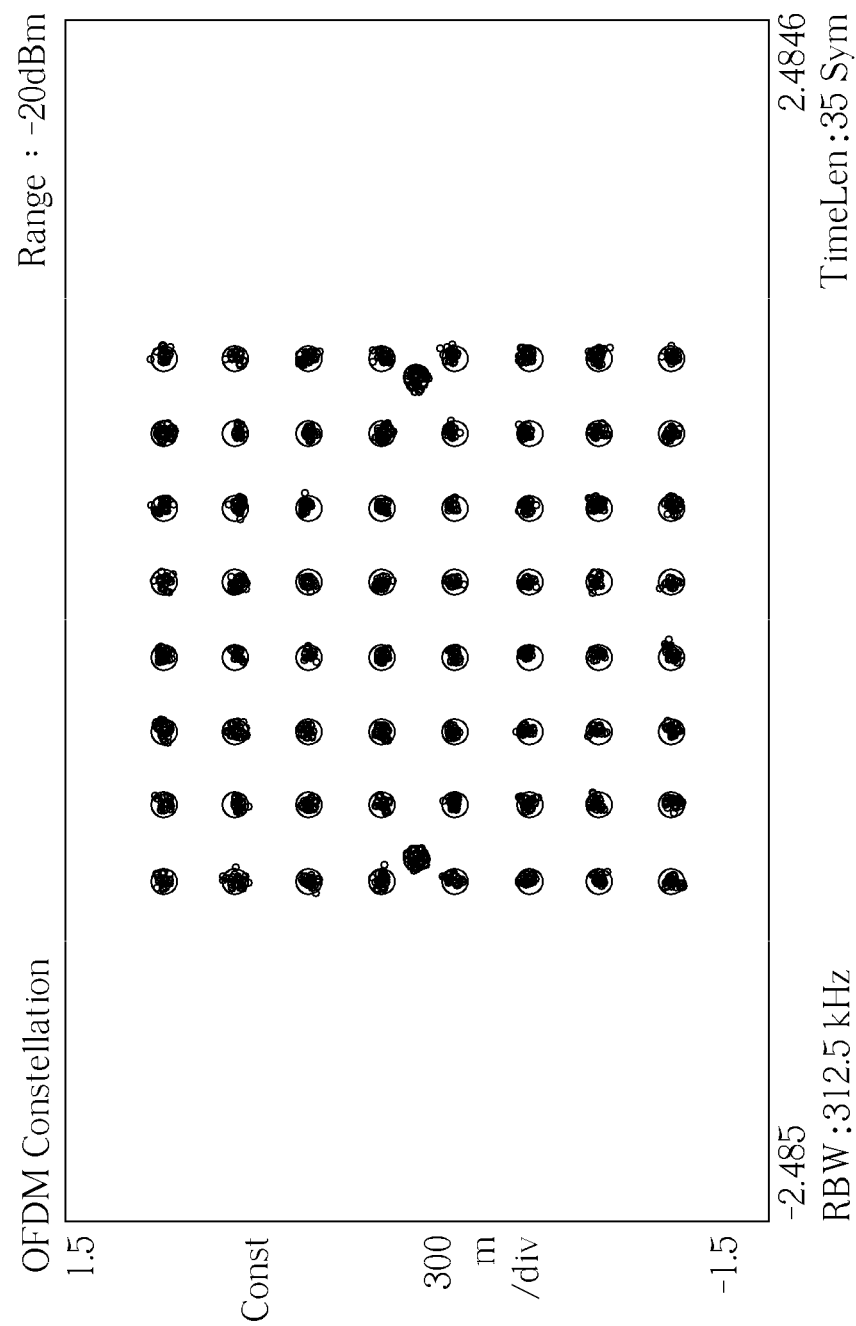
FIG. 4 is an OFDM 64-QAM constellation of the Wireless LAN device shown in FIG. 3 for an 802.11n Wireless LAN card.

Furthermore, the resistor 3820 parallel with the first capacitor 3822 does not only transform the control voltage Vctrl into the bias Vref, but also decreases power noise. Please refer to FIG. 4, which is an OFDM 64-QAM constellation of the Wireless LAN device 30 for an 802.11n Wireless LAN card. FIG. 4 shows that when the resistor 3820 and the first capacitor 3822 are designed with proper values, signal point deviations will not exist in the constellation. According to verification statistics of the embodiment of the present invention, the error vector magnitude (EVM) of the conventional Wireless LAN device 10 is −29.3 dB, whereas the EVM of the Wireless LAN device 30 is improved to −32 dB.

In addition, the embodiment of the present invention uses charging and discharging effects of the first capacitor 3822 to improve the problem that the output voltage of the voltage generator 301 drops in the instant a large current is supplied, for providing the stable bias Vref to the power amplifier 380. In other embodiments of the present invention, bypass capacitors are used in the Wireless LAN device 30 depending on requirements, for stabilizing the output voltage. For example, a second capacitor is used as a bypass capacitor connected to an input terminal of the power amplifier 380. One terminal of the second capacitor is coupled to the low-pass filter 382 and the power amplifier 380, and another terminal of the second capacitor is coupled to a ground terminal. Or, a third capacitor is also used as a bypass capacitor connected to an input terminal of the low-pass filter 382. One terminal of the third capacitor is coupled to the low-pass filter 382 and the baseband processing unit 300, and another terminal of the third capacitor is coupled to the ground terminal.

Figure 5:
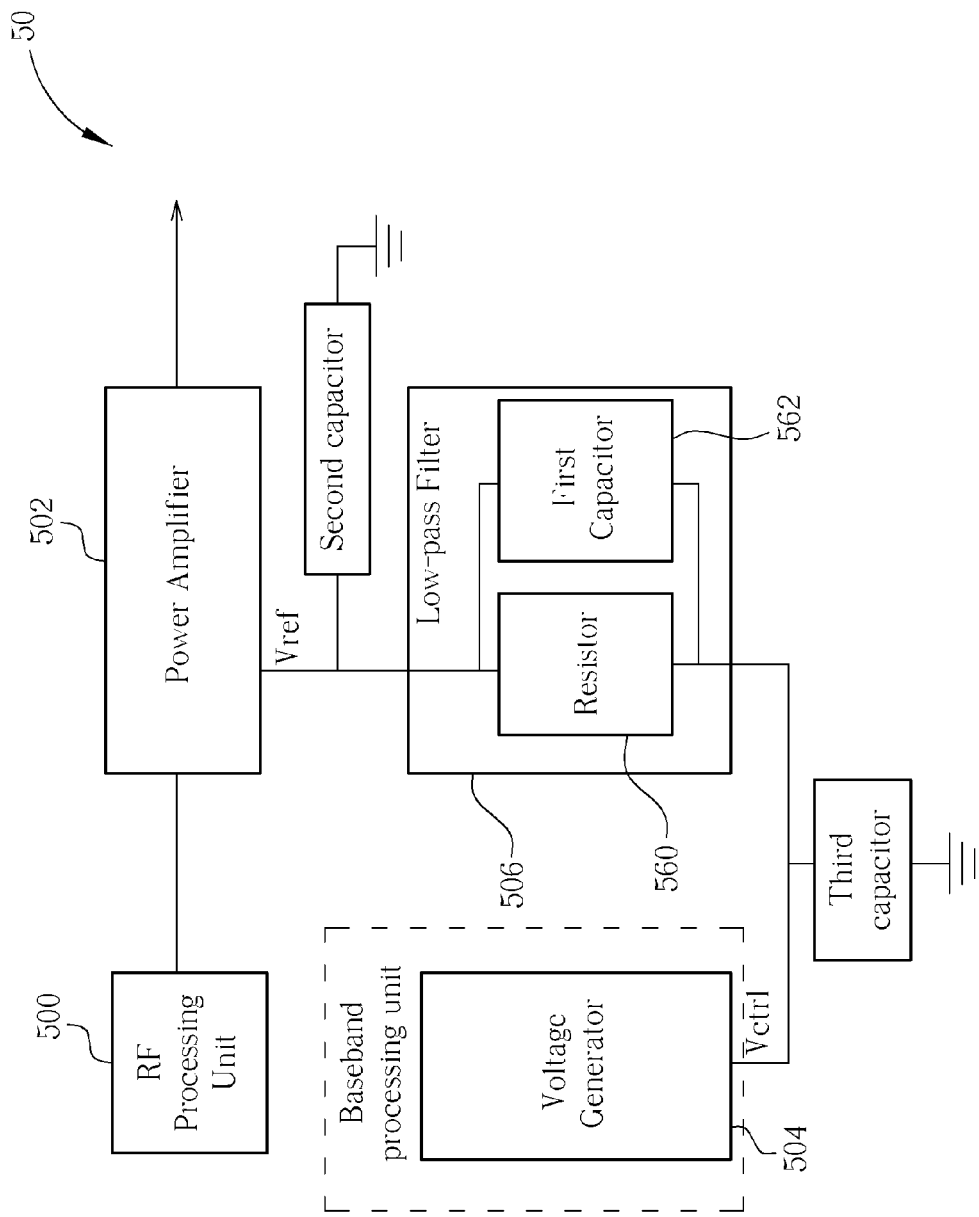
FIG. 5 is a schematic diagram of an RF transmitter according to an embodiment of the present invention.

Please refer to FIG. 5, which is a schematic diagram of an RF transmitter 50 according to an embodiment of the present invention. The RF transmitter 50 is similar to the RF transmitter 308 in FIG. 3, and is used in wireless communications products such as a Wireless LAN card and access point equipment. The RF transmitter 50 comprises an RF processing unit 500, a power amplifier 502, a voltage generator 504 and a low-pass filter 506. The RF processing unit 500 is utilized for generating an RF signal. The power amplifier 502 is coupled to the RF processing unit 500 and is driven by a bias Vref, and is utilized for amplifying power of the RF signal. The voltage generator 504 is included in a baseband processing unit of a Wireless LAN device, and is utilized for generating a control voltage Vctrl. The low-pass filter 506 comprises a resistor 560 and a first capacitor 562. The resistor 560 is coupled between the voltage generator 504 and the power amplifier 502, and is utilized for transforming the control voltage Vctrl into the bias Vref. The first capacitor 562 is coupled between the voltage generator 504 and the power amplifier 502. The first capacitor 562 is parallel with the resistor 560.

For detailed operation of the low-pass filter 506, please refer to the mentioned low-pass filter 382 in the Wireless LAN device 30. Similarly, the low-pass filter 506 helps provide the stable bias Vref to the power amplifier 502 and reduces signal errors caused by power noise. Therefore, the output linearity of the Wireless LAN device using the RF transmitter 50 is enhanced. Note that, the RF transmitter 50 is one embodiment of the present invention, and those skilled in the art can make alterations and modifications accordingly. Bypass capacitors can be used in the RF transmitter 50 to stabilize the output voltage. For example, a second capacitor is used as a bypass capacitor connected to an input terminal of the power amplifier 502, and a third capacitor is also used as a bypass capacitor connected to an input terminal of the low-pass filter 506.

In conclusion, the embodiment of the present invention provides a stable bias to the power amplifier and reduces signal errors caused by power noise. Compared with the prior art, the output linearity and efficiency of data transmission of the Wireless LAN device according to the embodiment of the present invention are enhanced.

Those skilled in the art will readily observe that numerous modifications and alterations of the device and method may be made while retaining the teachings of the invention.

What is claimed is:

1. A radio frequency (RF) transmitter for a Wireless Local Area Network (Wireless LAN) device comprising:
   an RF processing unit for generating an RF signal;
   a voltage generator for generating a control voltage;
   a power amplifier coupled to the RF processing unit and driven by a bias, for amplifying a power of the RF signal; and
   a low-pass filter coupled between the voltage generator and the power amplifier, for low-pass-filtering the control voltage to form the bias, comprising:
      a resistor comprising a first terminal coupled to the voltage generator and a second terminal coupled to the power amplifier;
      a first capacitor comprising a first terminal coupled to the first terminal of the resistor and a second terminal coupled to the second terminal of the resistor; and
      a second capacitor comprising one terminal coupled to the power amplifier and another terminal coupled to a ground terminal.

2. The RF transmitter of claim 1, wherein the voltage generator is included in a baseband processing unit of the Wireless LAN device.

3. The RF transmitter of claim 1, wherein the low-pass filter further comprises a third capacitor comprising one terminal coupled to the resistor, the first capacitor and the voltage generator, and another terminal coupled to the ground terminal.

4. A Wireless Local Area Network (Wireless LAN) device comprising:
   a voltage generator for generating regulated DC power;
   a baseband processing unit coupled to the voltage generator, for processing a baseband signal and generating a control voltage;
   an RF processing unit coupled to the voltage generator and the baseband processing unit, for generating an RF signal based on the baseband signal;
   an antenna; and
   an RF transmitter coupled to the baseband processing unit, the RF processing unit and the antenna, for transmitting the RF signal to the air via the antenna, the RF transmitter comprising:
      a power amplifier coupled between the RF processing unit and the antenna and driven by a bias, for amplifying a power of the RF signal; and
      a low-pass filter coupled between the baseband processing unit and the power amplifier, for low-pass-filtering the control voltage to form the bias, comprising:
         a resistor comprising a first terminal coupled to the baseband processing unit and a second terminal coupled to the power amplifier;
         a first capacitor comprising a first terminal coupled to the first terminal of the resistor and a second terminal coupled to the second terminal of the resistor; and
         a second capacitor comprising one terminal coupled to the power amplifier and another terminal coupled to a ground terminal.

5. The Wireless LAN device of claim 4, wherein the low-pass filter further comprises a third capacitor comprising one terminal coupled to the resistor, the first capacitor and the baseband processing unit and another terminal coupled to the ground terminal.

6. The Wireless LAN device of claim 4, further comprising an RF receiver coupled between the RF processing unit and the antenna, for receiving the RF signal via the antenna and outputting the RF signal to the RF processing unit.

7. A radio frequency (RF) transmitter for a Wireless Local Area Network (Wireless LAN) device comprising:
   an RF processing unit for generating an RF signal;
   a voltage generator included in a baseband processing unit for generating a control voltage;
   a power amplifier coupled to the RF processing unit and driven by a bias, for amplifying a power of the RF signal; and
   a resistor for forming the bias, comprising:
      a first terminal electrically connected to the voltage generator, and
      a second terminal electrically connected to the power amplifier; and
   a first capacitor for stabilizing the bias, comprising:
      a first terminal electrically connected to the first terminal of the resistor, and
      a second terminal electrically connected to the second terminal of the resistor.

8. The RF transmitter of claim 7, further comprising a second capacitor comprising one terminal coupled to the power amplifier and another terminal coupled to a ground terminal.

9. The RF transmitter of claim 7, further comprising a third capacitor comprising one terminal coupled to the resistor, the first capacitor and the baseband processing unit and another terminal coupled to a ground terminal.

* * * * *